United States Patent
Sung

[11] Patent Number: 6,137,328
[45] Date of Patent: Oct. 24, 2000

[54] CLOCK PHASE CORRECTION CIRCUIT

[75] Inventor: Jun Bae Sung, Kyoungki-do, Rep. of Korea

[73] Assignee: Hyundai Electronics Industries Co., Ltd., Ichon-shi, Rep. of Korea

[21] Appl. No.: 09/321,888

[22] Filed: May 28, 1999

[30] Foreign Application Priority Data

May 29, 1998 [KR] Rep. of Korea ....................... 98-19786

[51] Int. Cl.[7] ....................................................... H03L 7/06
[52] U.S. Cl. ............................................. 327/158; 327/161
[58] Field of Search .................................. 327/155, 156, 327/158, 159, 161, 162, 163

[56] References Cited

U.S. PATENT DOCUMENTS

| | | | |
|---|---|---|---|
| 5,295,164 | 3/1994 | Yamamura | ............................. 375/120 |
| 5,337,285 | 8/1994 | Ware et al. . | |
| 5,440,514 | 8/1995 | Flannagan et al. . | |
| 5,440,515 | 8/1995 | Chang et al. . | |
| 5,544,203 | 8/1996 | Casasanta et al. . | |
| 5,629,897 | 5/1997 | Iwamoto . | |
| 5,666,322 | 9/1997 | Conkle . | |
| 5,708,611 | 1/1998 | Iwamoto et al. . | |
| 5,740,115 | 4/1998 | Ishibashi et al. . | |
| 5,796,673 | 8/1998 | Foss et al. . | |
| 5,815,427 | 9/1998 | Cloud et al. . | |
| 5,818,788 | 10/1998 | Kimura et al. . | |
| 5,838,630 | 11/1998 | Okajima . | |
| 5,994,934 | 11/1999 | Yoshimura et al. | ..................... 327/158 |
| 6,005,426 | 12/1999 | Lin et al. | ................................. 327/158 |
| 6,043,694 | 3/2000 | Dortu | ..................................... 327/156 |

FOREIGN PATENT DOCUMENTS

WO 97/40576  10/1997  WIPO .

*Primary Examiner*—Toan Tran
*Assistant Examiner*—Paul Dinh
*Attorney, Agent, or Firm*—Jacobson, Price, Holman & Stern, PLLC

[57] ABSTRACT

A clock phase correction circuit for a semiconductor memory device reduces all lock ranges by using a half-mixer to a conventional delay locked loop (DLL) circuit, and thus generates a clock signal having a fast lock time and a very small jitter. In order to achieve this objective, a track portion having a plurality of phase converters and one half-mixer is provided between an input terminal of external clock and an input terminal of a delay means of the conventional DLL circuit, and approaches the phase of the external clock to a phase of the feedback clock. A phase difference between the corrected signal and the feedback clock is then reduced by the conventional DLL circuit. As a result, lock time becomes shorter, and the magnitude of a jitter becomes reduced.

4 Claims, 8 Drawing Sheets

CLOCK PHASE CORRECTION CIRCUIT

BACKGROUND OF THE INVENTION

1. Field of the Invention

The present invention relates to a clock phase correction circuit for a semiconductor memory device. More particularly, it relates to a clock phase correction circuit which reduces in advance all lock ranges by using a half-mixer to a conventional delay locked loop (hereinafter referred to as a DLL) circuit, and thus generates a clock signal having a fast lock time and a very small jitter.

2. Description of the Prior Art

In recent times, to solve a problem of a data set-up time and a data hold time, a clock phase correction circuit has been widely used to a high-speed synchronous dynamic random access memory (SDRAM), a rambus DRAM, a synclink DRAM, and a double data rate SDRAM, etc.

Generally, as a digital system's speed becomes faster, a phase locked loop (hereinafter referred to as a PLL) circuit or a DLL circuit has been employed to remove a skew or to eliminate the phase difference between an external clock Extclk and an internal clock Intclk.

The reason why the PLL circuit or DLL circuit is used will be described below.

A first reason is that a load of clock inside of a chip increases and a delay of a clock driver increases if a degree of integration of an integrated circuit becomes higher.

In this way, if the delay of the clock driver increases, a set-up time and a hold time increases, and a design of a system having a high operation frequency is restricted. At this time, a skew in the clock driver can be removed by using an on-chip PLL.

A second reason is that a clock being input to most chips cannot ensure a duty cycle of 50% although many circuits require the duty cycle of 50%. Therefore, to ensure the duty cycle of 50%, the circuits receive an external clock having a double frequency as compared with an internal clock's frequency, divide the external clock, and then use it.

In this case, there is a shortcoming that a frequency of the external clock Extclk increases, thus the PLL circuit should be employed to ensure the duty cycle.

A third reason is that a microprocessor is generally operated at a frequency higher than that of the external clock Extclk. This is very profitable to a system design. At this time, if the PLL circuit is employed to the system design, an internal clock having a frequency higher than the external clock's frequency can be produced.

The present invention relates to a DLL circuit.

The DLL circuit makes a coincident phase between the external clock Extclk and he internal clock Intclk. FIG. 1 is a block diagram of a conventional DLL circuit.

As shown in FIG. 1, the conventional DLL circuit includes:

- a phase detector 30 for detecting a phase difference between an external clock Extclk and a feedback clock Fbclk;
- a controller 20 which receives an output signal of the phase detector 30 as input, and controls a delay means 10;
- a delay means 10 which receives a control signal from the controller 20 as input, and adjusts a delay; and
- a model portion 40 for modeling a real physical delay.

The controller 20 can be differently constructed according to the type of the delay means 10.

FIG. 2 is a block diagram of a DLL circuit in which a counter 22 and a digital-to-analog converter 21 are used as a controller 20 in the case of an analog-type delay means 10.

FIG. 3 a block diagram of a DLL circuit in which an electric charge pump 23 is used as a controller 20 in the case of an analog-type delay means 10.

FIG. 4 is a block diagram of a DLL circuit in which a counter 22 and a selector 24 are used as a controller 20 in the case of a digital-type delay means 10.

Referring to FIGS. 2–3, in case of an analog-type delay means, the controller 20 can be constructed as a digital-to-analog converter 21 and a counter 22 or as an electric charge pump 23. In case of a digital-type delay means, as shown in FIG. 4, the controller 20 can be constructed as a selector 24 and a counter 22.

In operation of the conventional DLL circuit of FIG. 1, the phase detector 30 detects a phase difference between an external clock Extclk and a feedback clock Fbclk via the model portion 40 and transmits a high or low signal to the controller 20.

The controller 20 receives the high or low signal generated from the phase detector 30 and controls the delay means 10. A delay time of the delay means 10 is controlled by an output signal of the controller 20. By repeatedly performing this step, the same phase difference between the external clock and the internal clock is made.

At this time, assuming that a minimum delay time of the delay means 10 is defined as 1 step, the controller 20 cannot control a delay time below the 1 step. Also, assuming that a maximum delay time of the delay means 10 is defined as a max-delay, its magnitude determines the range of an operation frequency of the DLL circuit. That is, the operation of the DLL circuit is restricted by the magnitude of the max-delay. Owing to this reason, the conventional DLL circuit should increase the magnitude of the max-delay in order to reduce the magnitude of the 1 step and to increase an operation frequency range. As a result, an area occupied by the delay means 10 increases, thereby causing a problem to the effectiveness of the DLL circuit.

SUMMARY OF THE INVENTION

Accordingly, the present invention is directed to a clock phase correction circuit that substantially obviates one or more of the problems due to limitations and disadvantages of the related art.

It is an object of the present invention to provide a clock phase correction circuit which provides a plurality of phase converters and a half-mixer between an external clock input terminal and a delay means, enhances a lock time of DLL circuit, and reduces a magnitude of a jitter.

The plurality of phase converters are connected in series to each other, and are controlled by a feedback clock generated from a model portion. A phase-controlled external clock generated from the half-mixer is transmitted to the delay means.

To achieve the above objectives, in a clock phase correction circuit for receiving an external clock and generating an internal clock, a clock phase correction circuit includes: a delay means for generating the internal clock; a model portion for receiving the internal clock generated from the delay means as an input and generating a feedback clock; a phase detector for receiving the external clock and the feedback clock generated from the model portion, comparing a phase of the external clock with a phase of the feedback clock, and generating a detection signal; a controller which is operated by the detection signal generated from the phase detector and transmits a control signal of controlling the delay means to the delay means; and a track portion which receives the external clock, an inversion external clock of inverting the external clock, and the feedback clock and reduces a phase difference between the external clock and the feedback clock, wherein the delay means which receives an output signal of the track portion as an input is controlled by a control signal from the controller and generates the internal clock.

The track portion includes a plurality of phase converters connected in series to each other. The plurality of phase converters detect a phase of the feedback clock, and sequentially approache the external clock phase to the feedback clock phase.

According to another aspect of the present invention, in a clock phase correction circuit for receiving an external clock and generating an internal clock, a clock phase correction circuit includes: a model portion for receiving the internal clock as an input and generating a feedback clock; a plurality of phase converters connected in series which receives the external clock, an inverted external clock, and the feedback clock, and reduce a phase difference between the external clock and the feedback clock; and a half-mixer which receives a pair of output signals of the plurality of phase converters, the output signals having a different phase, and generates the internal clock that has a phase of an intermediate value of a phase difference between the pair of output signals, wherein the plurality of phase converters detect a phase of the feedback clock, and sequentially approach a phase of the external clock to the phase of the feedback clock.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENT

A preferred embodiment of the present invention will now be described in detail with reference to the accompanying drawings.

For reference, a term 'upper limit' will now be used in this specification in order to divide the range of a phase. For example, if a clock phase is positioned between 0° and 90°, it is called '1 upper limit'. If a clock phase is positioned between 90° and 180°, it is called '2 upper limit'. If a clock phase is positioned between 180° and 270°, it is called '3 upper limit'. Finally, if a clock phase is positioned between 270° and 360°, it is called '4 upper limit'.

Figure 5:
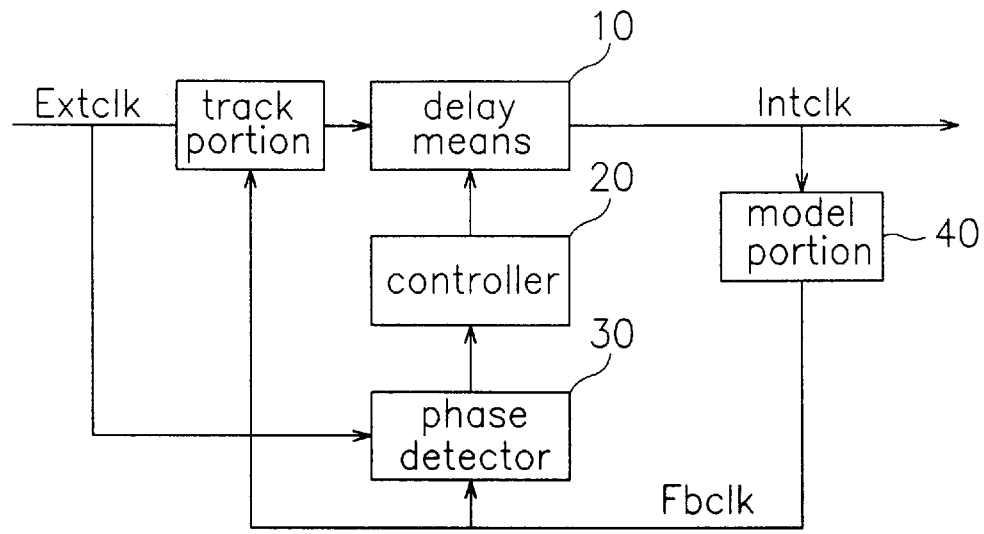
FIG. 5 is a block diagram of a DLL circuit according to the present invention.

FIG. 5 is a block diagram of a DLL circuit according to the present invention.

Figure 1:
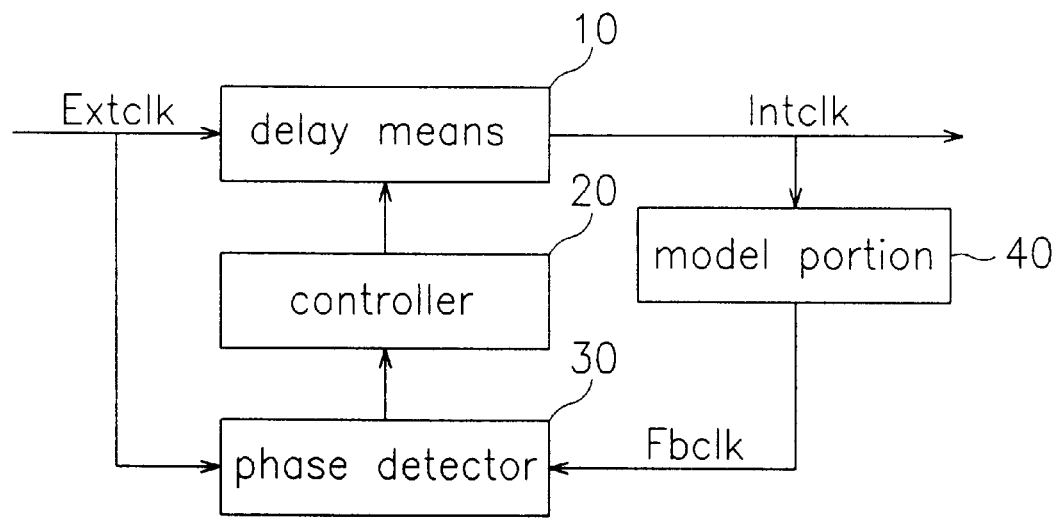
FIG. 1 is a block diagram of a conventional DLL circuit.
Figure 2:
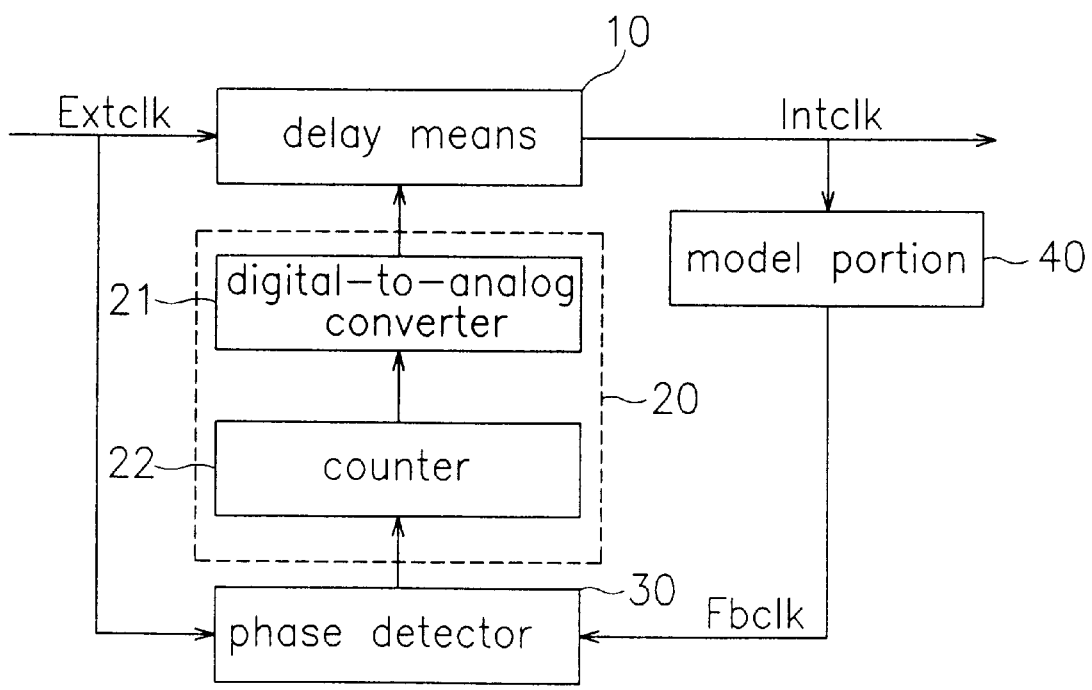
FIG. 2 is a block diagram of a conventional DLL circuit in which a counter and a digital-to-analog converter are used as a controller in the case of an analog-type delay means.
Figure 3:
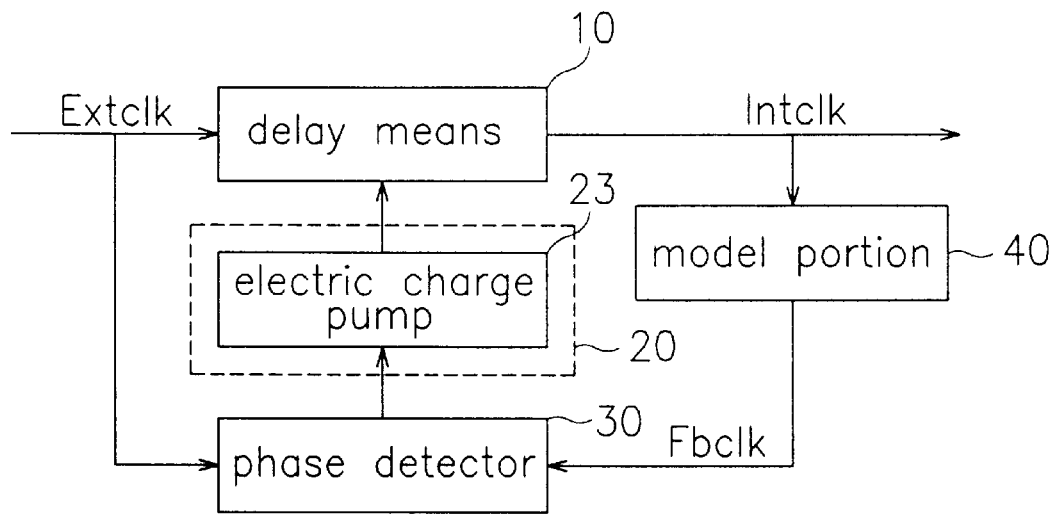
FIG. 3 is a block diagram of a conventional DLL circuit in which an electric charge pump is used as a controller in the case of an analog-type delay means.
Figure 4:
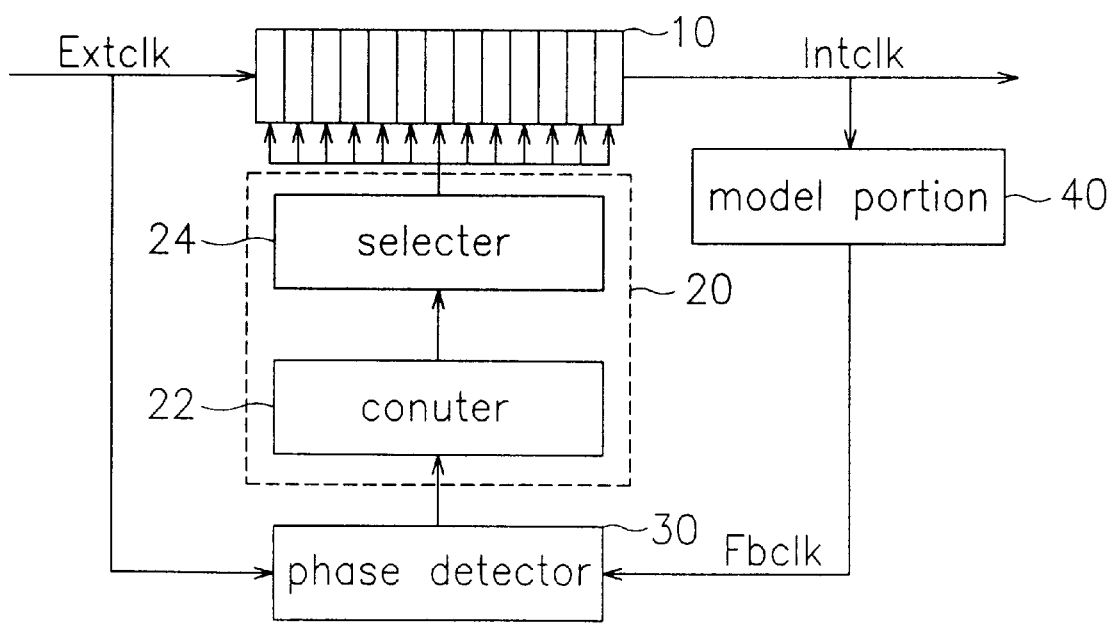
FIG. 4 is a block diagram of a conventional DLL circuit in which a counter and a selector are used as a controller in the case of a digital-type delay means.

As shown in FIG. 5, since a track portion 50 is added to the conventional DLL circuit shown in FIG. 1, a phase of an external clock Extclk is previously adjacent to a phase of a feedback clock Fbclk. After that, a phase difference between a clock compensated by the track portion 50 and a feedback clock Fbclk is reduced by the conventional DLL circuit, so that a clock signal having a fast lock time and a very small jitter is made. Such track portion 50 will now be described in detail.

Figure 6:
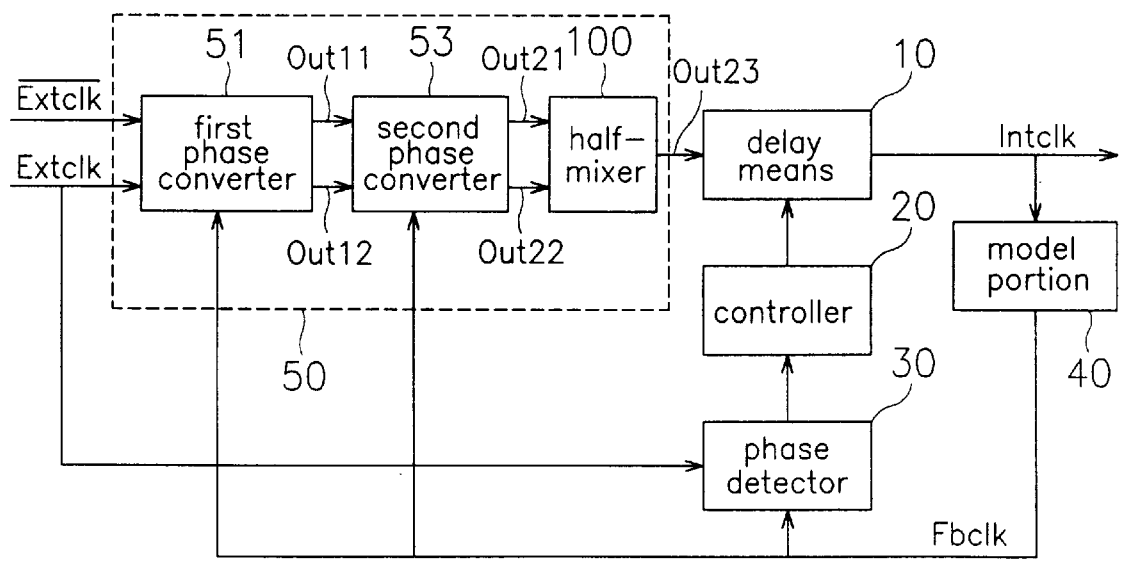
FIG. 6 is a block diagram of a DLL circuit which quickly corrects a phase difference by using a first phase converter, a second phase converter and a half-mixer in a track portion of FIG. 5, in accordance with a preferred embodiment of the present invention.

FIG. 6 is a block diagram of a DLL circuit in accordance with a first preferred embodiment of the present invention.

As shown in FIG. 6, the DLL circuit according to the present invention includes: a track portion 50 for receiving two external clocks Extclk and /Extclk having a phase difference of 180° therebetween and a feedback clock Fbclk; a delay portion 10 which receives an output signal OUT23 of the track portion 50 as an input, controls a delay time by an output signal of a controller 20, and generates an internal clock Intclk; a model portion 40 which receives the internal clock Intclk as an input and generates a feedback clock Fbclk; a phase detector 30 which compares a phase of the feedback clock Fbclk generated from the model portion 40 with a phase of the external clock Extclk and outputs a high or low signal to the controller 20; and a controller 20 which receives an output signal of the phase detector 30 as an input and generates a signal for controlling the delay portion 10.

The track portion 50 includes: a first phase converter 51 for receiving two external clocks Extclk and /Extclk having a phase difference of 180° therebetween and a feedback clock Fbclk; a second phase converter 53 for receiving two output signals OUT11 and OUT12 of the first phase converter 51 and a feedback clock Fbclk; and a half-mixer 100 for receiving two output signals OUT21 and OUT22 of the second phase converter 53 and generating an output signal OUT23.

Operations of the DLL circuit according to the first preferred embodiment shown in FIG. 6 are as follows.

Once the external clocks Extclk and /Extclk are input to the first phase converter 51, the first phase converter 51 selects one upper limit including the feedback clock Fbclk, among four kinds of upper limits and generates two output signals OUT11 and OUT12 being used as a standard of the selected upper limit.

Figure 11:
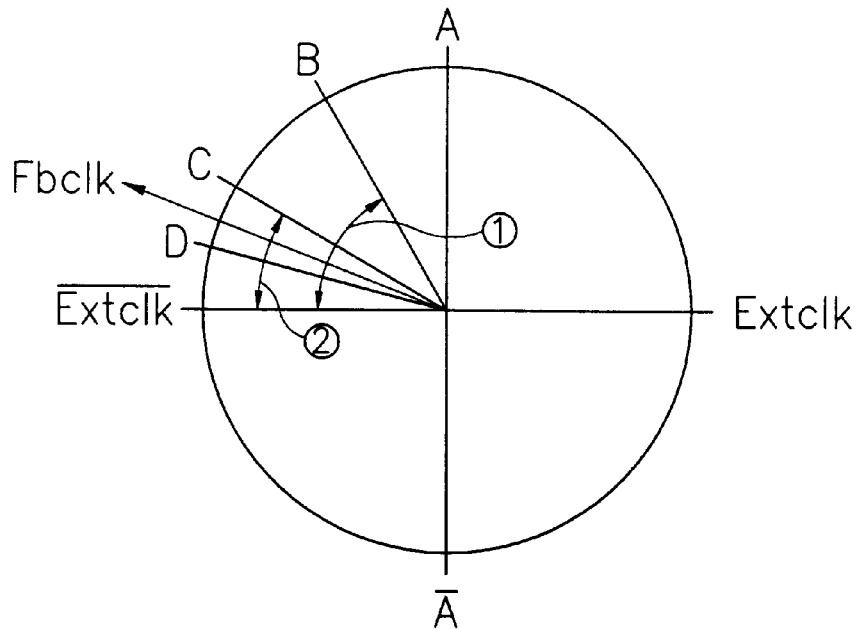
FIG. 11 is an operation phase diagram regarding FIG. 6.

For more understanding, the operations of FIG. 6 will be more specifically described with reference to FIG. 11 showing an operation phase diagram of FIG. 6.

As shown in FIG. 11, if a feedback clock phase is positioned within '2 upper limit', a signal of phase A and an external clock /Extclk are selected and input to the second phase converter 53.

Figure 7:
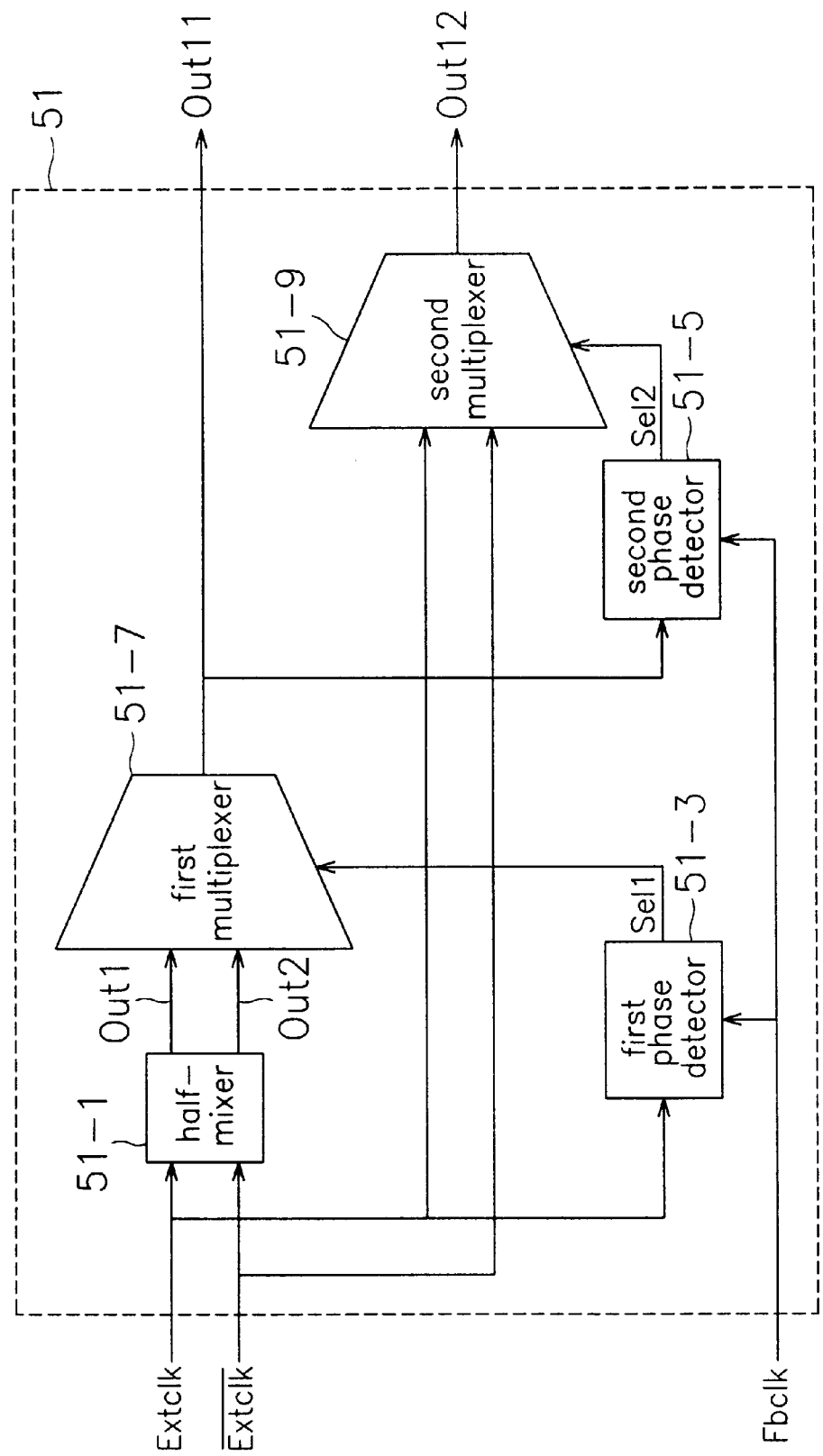
FIG. 7 is a detailed block diagram of a first phase converter of FIG. 6.

In this manner, a detailed block diagram of the first phase converter 51 for generating the signal having phase A and the external clock /Extclk is shown in FIG. 7.

As shown in FIG. 7, the first phase converter 51 includes:
a half-mixer 51-1 for receiving two external clocks Extclk and /Extclk, and generating two output signals OUT1 and OUT2;
a first phase detector 51-3 which receives the external clock Extclk and a feedback clock Fbclk as an input, compares a phase of the external clock Extclk with a phase of the feedback clock Fbclk, and generates an output signal SEL1;
a first multiplexer 51-7 which receives the two output signals OUT1 and OUT2 of the half-mixer 51-1 as an input and generates an output signal OUT11 by a control of the output signal SEL1 of the first phase detector 51-3;
a second phase detector 51-5 which receives the output signal OUT11 of the first multiplexer 51-7 and the feedback clock Fbclk, compares a phase of the output signal OUT11 with a phase of the feedback clock Fbclk, and generates an output signal SEL2; and
a second multiplexer 51-9 which receives two external clocks Extclk and /Extclk as input and generates an output signal OUT12 by a control of the output signal SEL2 of the second phase detector 51-5.

The signal having the phase A and the external clock /Extclk will be described with reference to FIG. 7.

First, as shown in FIG. 11, the half-mixer 51-1 produces a signal having a phase A and a signal having a phase /A.

Herein, the half-mixer 51-1 functions as an analog multiplier. In view of a phase, the half-mixer 51-1 receives two signals having a different phase as an input and generates a signal of which phase corresponds to an intermediate value of the two phases.

Accordingly, the first phase converter 51 receives the two external clocks Extclk and /Extclk, generates a signal A having a phase 90° and a signal /A having a phase 270°, and inputs the two signals A and /A to the first multiplexer 51-7.

In the meantime, the first phase detector 51-3 receives the external clock Extclk and the feedback clock Fbclk as input, and compares a phase of the external clock Extclk with a phase of the feedback clock Fbclk.

At this time, since the first phase detector 51-3 can detect a phase difference of 180°, the first phase detector 51-3 outputs a signal SEL1 to the first multiplexer 51-7 in order to make the first multiplexer 51-7 select a signal having a phase A. Thus, the first multiplexer 51-7 generates a signal OUT11 having a phase A.

The second phase detector 51-5 detects a phase difference between the signal A and the feedback clock Fbclk. Since the phase of the feedback clock Fbclk is positioned within 180° with reference to the signal of A as shown in FIG. 11, the second phase detector 51-5 transmits a signal SEL2 to a second multiplexer 51-9 in order to make the second multiplexer 51-9 select the external clock /Extclk. Thus, the second multiplexer 51-9 generates the external clock /Extclk as an output signal OUT12.

Thereafter, two reference signals A and /Extclk selected by the above steps are input to the second phase converter 53 shown in FIG. 6.

The second phase converter 53 selects and generates a signal OUT21 having an intermediate phase between the signal of phase A and the signal /Extclk generated from the first phase converter 51. The second phase converter 53 selects one signal between the signal of phase A and the signal /Extclk and then outputs the selected one signal as an output signal OUT22. Referring to FIG. 11, a signal of phase B is generated as one output signal OUT21, and the signal /Extclk is generated as another output signal OUT22.

Figure 8:
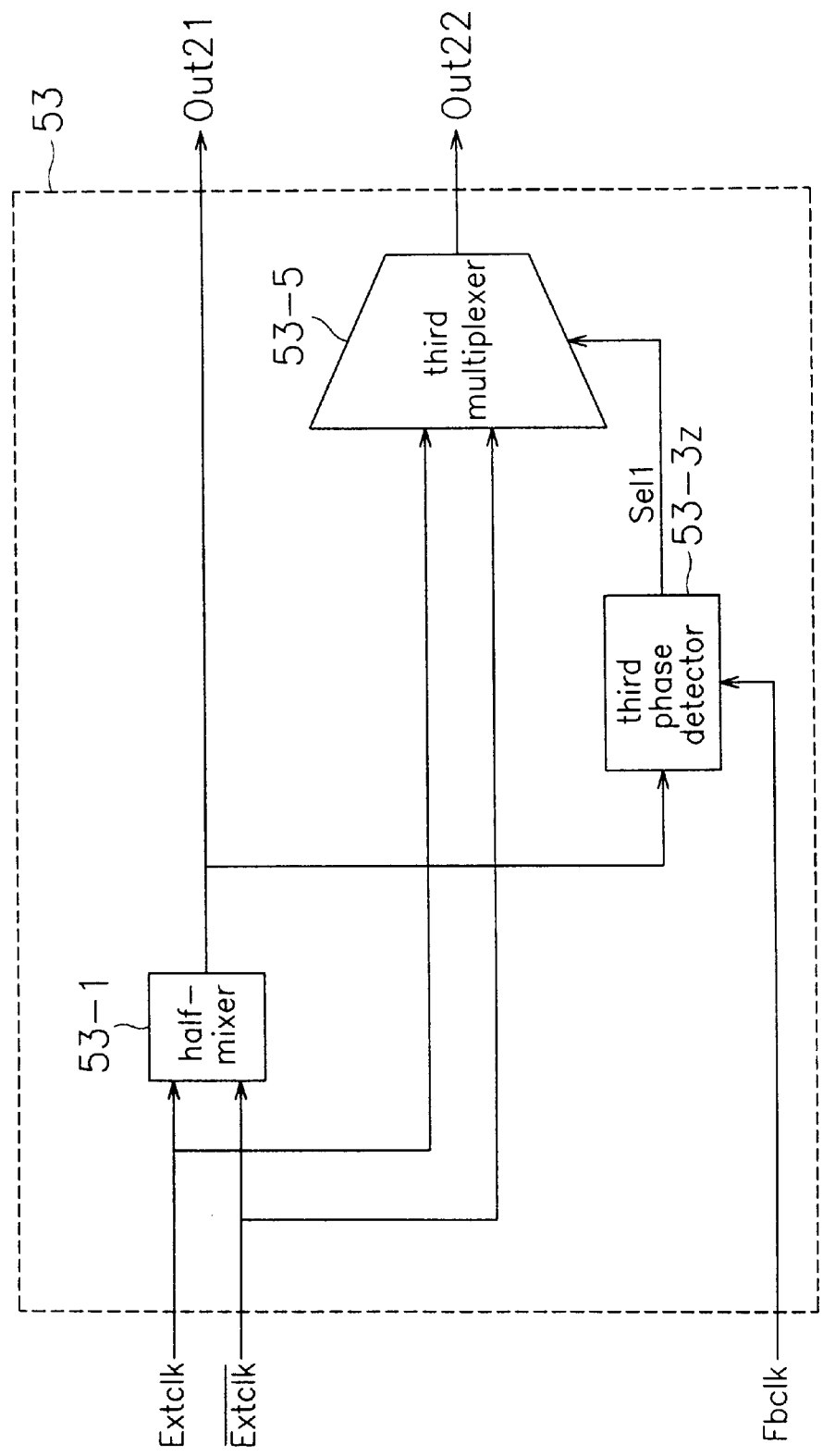
FIG. 8 is a detailed block diagram of the second phase converter of FIG. 6.

FIG. 8 is a detailed block diagram of the second phase converter 53 of FIG. 6.

As shown in FIG. 8, the second phase converter 53 includes:
a half-mixer 53-1 which receives two output signals OUT11 and OUT12 as an input and generates an output signal OUT21;
a third phase detector 53-3 which receives the output signal OUT21 of the half-mixer 53-1 and a feedback clock Fbclk, compares a phase of the output signal OUT21 with a phase of the feedback clock Fbclk, and generates an output signal SELL of a high or low level; and
a third multiplexer 53-5 which receives two output signals OUT11 and OUT12 of the first phase converter 51 as an input, and generates an output signal OUT22 by a control of the output signal SELL of the third phase detector 53-3.

Operations of the second phase converter 53 will be described with reference to FIG. 11.

A half-mixer 53-1 receives the signal A and the signal /Extclk generated from the first phase converter 51 and generates a signal B having an intermediate phase between the signal A and the signal /Extclk as an output signal OUT21.

In the meantime, the third phase detector 53-3 receives the signal A generated from the half-mixer 53-1 and the feedback clock Fbclk as an input and detects a phase difference between the signal A and the feedback clock Fbclk. After that, since the phase of the feedback clock Fbclk is positioned within 180° with reference to the signal B, the third phase detector 53-3 transmits an output signal SEL1 to a third multiplexer 53-5 in order to make the third multiplexer 53-5 select the clock signal /Extclk.

Finally, the third multiplexer 53-5 selects the clock signal /Extclk between the signal A and the clock signal /Extclk by the signal SEL1, and generates the clock signal /Extclk as an output signal OUT22.

Then, the signal B and the clock signal /Extclk generated from the second phase converter 53 are input to the last half-mixer 100.

Figure 9:
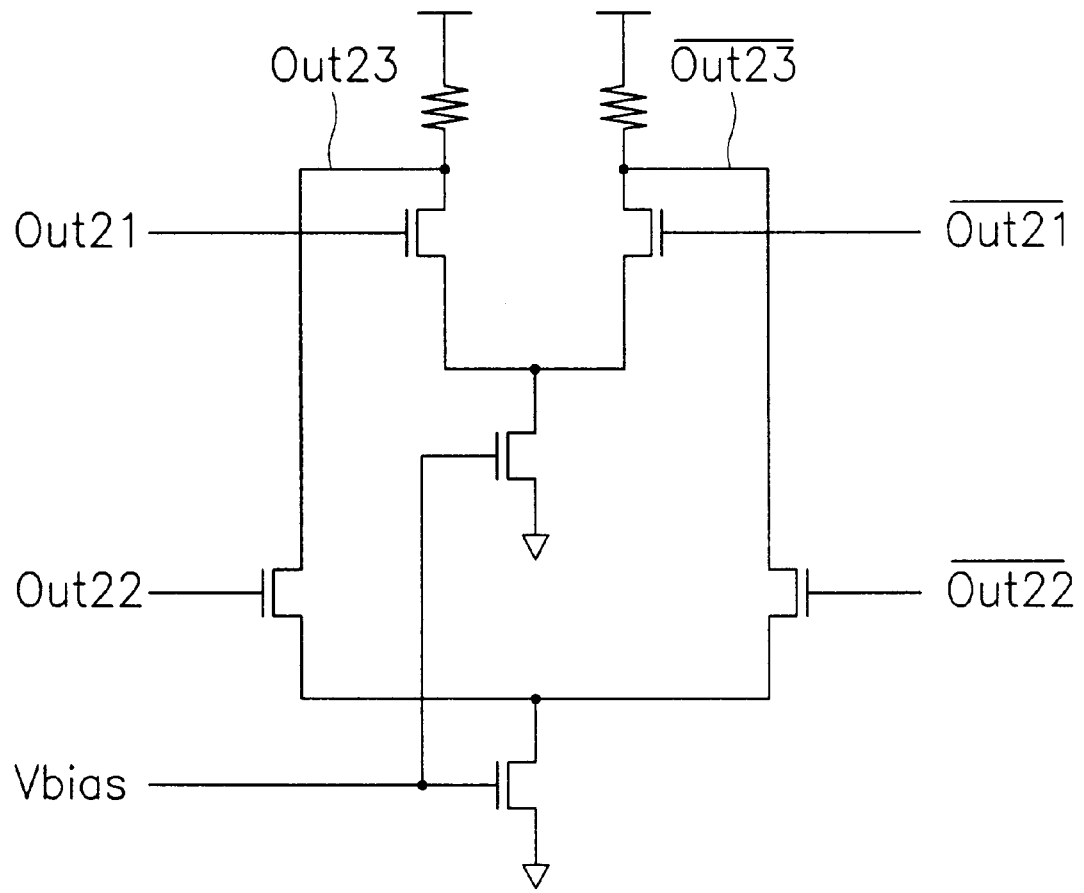
FIG. 9 is a detailed block diagram of the half-mixer of FIG. 6.

FIG. 9 is a detailed block diagram of the half-mixer 100 of FIG. 6. The half-mixer 100 generates a signal having an intermediate phase between two input signals. Referring to FIG. 11, the signals B and /Extclk generated from the second phase converter 53 are input to the input terminals of the signals OUT21 and OUT22. The inverting signals /B and Extclk of the signals B and /Extclk are input to the input terminals /OUT21 and /OUT22, thus an output terminal OUT23 generates a signal C as shown in FIG. 11.

Finally, as shown in FIG. 6, the conventional DLL part gradually reduces a phase difference between the output signal OUT23 (i.e., the signal C of FIG. 11) of the half-mixer 100 and the feedback clock Fbclk.

Referring to FIG. 11, a phase of the feedback clock Fbclk is positioned between the signal B and the clock signal /Extclk, the signal of phase C is moved by the conventional DLL circuit, so that the signal of phase C becomes adjacent to the phase of the feedback clock Fbclk. Accordingly, the conventional DLL circuit is designed to be freely moved only within the interval ①. That is, the conventional DLL circuit is designed to have only a lock range within 45° (±22.5°).

Assuming that the same block as the second phase converter 53 is additionally provided to FIG. 6, the output signal OUT23 of the last half-mixer 100 becomes a signal having a phase D in FIG. 11. Therefore, the conventional DLL circuit is designed to be freely moved only within the interval ②. That is, the conventional DLL circuit is designed to have only a lock range within 22.5° (±11.25°).

Figure 10:
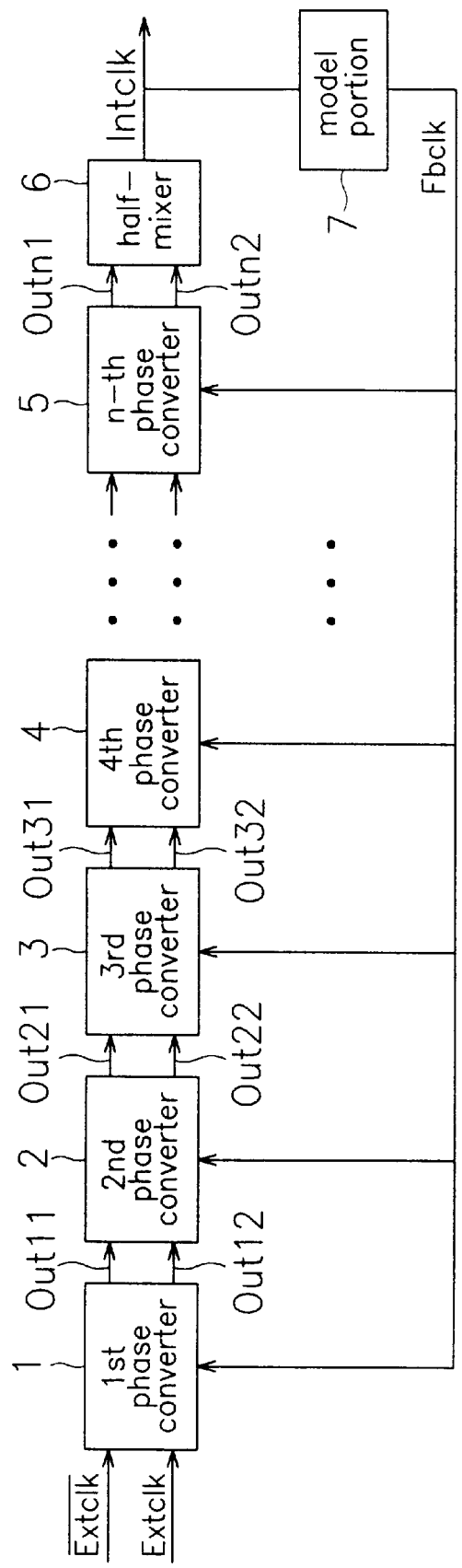
FIG. 10 is a block diagram of a DLL circuit which quickly corrects a phase difference by using a plurality of phase converters in accordance with another preferred embodiment of the present invention.

FIG. 10 is a block diagram of a DLL circuit in accordance with the second preferred embodiment of the present invention.

As shown in FIG. 10, the DLL circuit according to the second preferred embodiment includes: N phase converters (1st, 2nd, 3rd, . . . , N-th phase converters) which are connected in series between the input terminals of two external clocks Extclk and /Extclk and an input terminal of a half-mixer 6 generating an internal clock Intclk; and a model portion 7 which receives the internal clock Intclk generated from the half-mixer 6 as an input and outputs a feedback clock Fbclk to each phase converter.

Herein, the first phase converter 1 selecting one upper limit among 4 upper limits should be positively used, its detailed circuit is identical with FIG. 7.

The second phase converter 2 to the n-th phase converter 5 have the same structures, and are shown in FIG. 8. The detailed circuit diagram of the half-mixer 6 is shown in FIG. 9.

Hereinafter, operations of the above second preferred embodiment ranging from 1st phase converter to 4th phase converter will be described with reference to FIG. 12.

The first phase converter 1 receives the external clocks Extclk and /Extclk having a phase difference 180° therebetween and generates two output signals OUT11 and OUT12.

Figure 12:
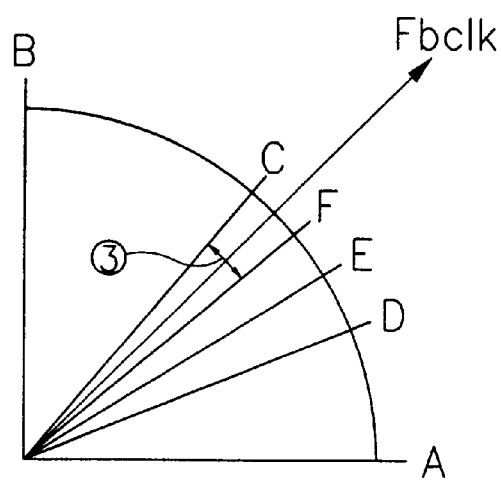
FIG. 12 is an operation phase diagram regarding FIG. 10.

If the phase of the feedback clock Fbclk is positioned within '1 upper limit' as shown in FIG. 12, the first phase converter 1 generates a signal of phase A as the output signal OUT11 and generates a signal of phase B as the output signal OUT12.

At this time, the signal of phase A is the same signal as the external clock Extclk.

The second phase converter 2 receives the output signals OUT11 and OUT12 as input and generates the output signals OUT21 and OUT22. Referring to FIG. 12 showing an operation phase diagram regarding FIG. 10, the second phase converter 2 generates the signal of phase C as the output signal OUT21 and generates a signal of phase A (the same phase as the signal Extclk) as the output signal OUT22 because a phase of the feedback clock Fbclk is positioned outside of the phase of the signal C by 180°.

A third phase converter 3 receives the output signals OUT21 (i.e., C of FIG. 12) and OUT22 (i.e., A of FIG. 12) as input and generates two output signals OUT31 and OUT32.

As seen in FIG. 12, a signal of phase D is generated as the output signal OUT31, and a signal of phase C is generated as the output signal OUT32 because a phase of the feedback clock Fbclk is positioned within 180° than a phase of the signal D.

A fourth phase converter 4 receives the two signals C and D shown in FIG. 12 as an input, and generates a signal of phase C because a signal of phase E and a phase of the feedback clock Fbclk are positioned within 180° than the phase of the signal E.

The last half-mixer 6 receives two signals C and E of FIG. 12 as an input, and generates a signal (i.e., F of FIG. 12) having an intermediate phase as an output signal Intclk.

Accordingly, the phase of the feedback clock Fbclk is positively positioned within the interval ③ of FIG. 12 with a maximum phase difference between the external clock and the feedback clock Fbclk as follows.

The last output signal Intclk has the following range, $$(PI/2^{(N+1)} < Intclk < +(PI/2^{(N+1)}))$$

where, PI:n, 180°.

The model portion 7 has a fixed delay in FIG. 10, so that a feedback clock Fbclk has the following range, $$(PI/2^{(N+1)} < Fbclk < +(PI/2^{(N-1)}))$$

where, PI:n, 180°.

Accordingly, a maximum phase difference between the external clock and the feedback clock becomes $PI/2^{(N+1)}$. In the above circuit including the first to fourth phase converters 1–4, a maximum phase difference between the external clock and the feedback clock is:

$$PI/2^{(N+1)} = PI/2^5 = PI/32 = 5.6250.$$

Thus, the maximum phase difference is satisfied with a product specification of the internal clock Intclk.

In the present invention, although the half-mixer connected to the plurality of phase converters is removed, the objective of the present invention can be readily made by those skilled in the art.

As described above, the present invention previously compensates a phase of the external clock by using a plurality of phase converters, and then applies the compensated signal to the conventional DLL circuit, so that a DLL circuit having a smaller step than the conventional DLL circuit by 1 step can be designed. Also, since the present invention has all lock ranges, the lock range is highly improved as compared with the conventional lock range 180°. In addition, the present invention can enlarge a frequency range. As seen from the second preferred embodiment, the present invention embodies a function of the DLL circuit by increasing the number of phase converters without using a general DLL circuit according to a required product specification. Accordingly, the quality of a performance can be conveniently controlled in all application fields of the DLL circuit.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A clock phase correction circuit for receiving an external clock and generating an internal clock, the clock phase correction circuit comprising:

a delay means for generating the internal clock;

a model portion for receiving the internal clock generated from the delay means as an input and generating a feedback clock;

a phase detector for receiving the external clock and the feedback clock generated from the model portion, comparing a phase of the external clock with a phase of the feedback clock, and generating a detection signal;

a controller which is operated by the detection signal generated from the phase detector and transmits a control signal to the delay means to control the delay means; and a track portion which receives the external clock, an inverted external clock, and the feedback clock and reduces a phase difference between the external clock and the feedback clock, wherein the delay means which receives an output signal of the track portion as input is controlled by a control signal from the controller, and generates the internal clock.

2. A clock phase correction circuit as set forth in claim 1, wherein the track portion includes a plurality of phase converters connected in series to each other, wherein the plurality of phase converters detect a phase of the feedback clock, and sequentially approach the external clock phase to the feedback clock phase.

3. A clock phase correction circuit as set forth in claim 1, wherein the track portion comprises:

a plurality of phase converters being connected in series; and a half-mixer which receives a pair of output signals of the plurality of phase converters, the output signals having a different phase, and generates the internal clock that has a phase of intermediate value of a phase difference between the pair of output signals, wherein the plurality of phase converters detect a phase of the feedback clock, and sequentially approach a phase of the external clock to the phase of the feedback clock.

4. A clock phase correction circuit for receiving an external clock and generating an internal clock, the clock phase correction circuit comprising:

a model portion for receiving the internal clock as an input, and generating a feedback clock;

a plurality of phase converters connected in series, which receive the external clock, an inversion external clock of inverting the external clock, and the feedback clock, and reduce a phase difference between the external clock and the feedback clock; and a half-mixer which receives a pair of output signals of the plurality of phase converters, the output signals having a different phase, and generates the internal clock that has a phase of intermediate value of a phase difference between the pair of output signals, wherein the plurality of phase converters detect a phase of the feedback clock, and sequentially approach a phase of the external clock to the phase of the feedback clock.

* * * * *